United States Patent
Hwang et al.

(10) Patent No.: US 9,163,884 B2
(45) Date of Patent: Oct. 20, 2015

(54) HEAT DISSIPATING APPARATUS WITH VORTEX GENERATOR

(75) Inventors: Jer-Sheng Hwang, Taoyuan (TW); Sheam-Chyun Lin, Taoyuan (TW)

(73) Assignee: ENERMAX TECHNOLOGY CORPORATION, Taoyuan County (TW)

(*) Notice: Subject to any disclaimer, the term of this patent is extended or adjusted under 35 U.S.C. 154(b) by 716 days.

(21) Appl. No.: 13/108,572

(22) Filed: May 16, 2011

(65) Prior Publication Data
US 2012/0103573 A1 May 3, 2012

(30) Foreign Application Priority Data
Nov. 3, 2010 (TW) .............................. 099221253 U

(51) Int. Cl.
| | |
|---|---|
| *F28F 7/00* | (2006.01) |
| *F28F 1/32* | (2006.01) |
| *F28D 15/02* | (2006.01) |
| *H01L 23/367* | (2006.01) |
| *H01L 23/427* | (2006.01) |
| *H01L 23/467* | (2006.01) |

(52) U.S. Cl.
CPC ............ *F28F 1/325* (2013.01); *F28D 15/0275* (2013.01); *H01L 23/3672* (2013.01); *H01L 23/427* (2013.01); *H01L 23/467* (2013.01); *H01L 2924/0002* (2013.01)

(58) Field of Classification Search
CPC .... F28F 1/325; F28D 15/0275; H01L 23/427; H01L 23/3672; H01L 23/467
USPC ................ 165/80.3, 104, 104.33, 109.1, 151, 165/80.2, 104.26
See application file for complete search history.

(56) References Cited

U.S. PATENT DOCUMENTS

| | | | | |
|---|---|---|---|---|
| 1,853,315 | A * | 4/1932 | Modine ................... | F28F 1/325 165/151 |
| 4,817,709 | A * | 4/1989 | Esformes ................... | 165/151 |
| 4,830,102 | A * | 5/1989 | Bakay et al. ............ | F28F 1/325 165/151 |
| 5,567,395 | A * | 10/1996 | Okabe et al. ................... | 422/180 |
| 5,730,214 | A * | 3/1998 | Beamer et al. ................ | 165/152 |
| 7,337,831 | B2 * | 3/2008 | Torii ......................... | F28F 1/32 165/109.1 |
| 7,961,462 | B2 * | 6/2011 | Hernon ......................... | 361/694 |
| 8,381,802 | B2 * | 2/2013 | Nishino ................... | F28F 1/325 165/109.1 |
| 8,505,618 | B2 * | 8/2013 | Ogawa et al. .................. | 165/151 |

(Continued)

FOREIGN PATENT DOCUMENTS

CN 201488626 U * 5/2010 ................ F28F 3/00

*Primary Examiner* — Marc Norman
*Assistant Examiner* — Jon T Schermerhorn
(74) *Attorney, Agent, or Firm* — Chun-Ming Shih; HDLS IPR SERVICES

(57) ABSTRACT

A heat dissipating apparatus with a vortex generator includes a heat conducting base, a heat pipe, and a plurality of heat dissipating fins. Each heat dissipating fin has a pair of vortex generators installed with an interval apart and disposed adjacent to a side of the heat pipe, and each vortex generator has two guiding oblique surfaces protruding from a surface of the heat dissipating fin, and the two guiding oblique surfaces protrude in a tapered form. A through hole is formed at a wide position of the tapered form and penetrates through the heat dissipating fin, such that the vortex generators of each heat dissipating fin induce a stack effect at corresponding upper and lower part of the heat dissipating fin to improve the heat dissipating efficiency.

7 Claims, 7 Drawing Sheets

(56) References Cited

U.S. PATENT DOCUMENTS

| | | |
|---|---|---|
| 2003/0024687 A1* | 2/2003 | Cheng et al. .................. 165/80.3 |
| 2004/0194936 A1* | 10/2004 | Torii ............................. 165/151 |
| 2007/0051502 A1* | 3/2007 | Yamauchi ..................... 165/151 |
| 2008/0121385 A1* | 5/2008 | Kim .............................. 165/151 |
| 2009/0014159 A1* | 1/2009 | Nishino .................. F28F 13/12 165/109.1 |
| 2009/0199585 A1* | 8/2009 | Ogawa et al. ................. 62/324.2 |
| 2010/0025013 A1* | 2/2010 | Zha ............................. 165/80.3 |

\* cited by examiner

HEAT DISSIPATING APPARATUS WITH VORTEX GENERATOR

FIELD OF THE INVENTION

The present invention relates to a heat dissipating apparatus, in particular to a heat dissipating apparatus capable of generating vortices by a vortex generator and providing a stack effect.

BACKGROUND OF THE INVENTION

In recent years, vortex generator is considered as one of the passive thermal conductivity enhancement technologies, and it combines small protrusions such as embossments, stamps and punches with a main thermal exchange surface such as the surface of a heat dissipating fin by a manufacturing method, thereby preventing possible separations occurred at the boundary and reducing frictions. In addition to the advantage of having a better thermal conductivity enhancement of the heat dissipating fin, the vortex generator also has a smaller pressure drop.

In the past, vortex generators applied to heat dissipating fins generally use vortex energy to facilitate an exchange of heat with air. However, the effect is still not good enough, because the produced vortices only flow in a direction based on the airflow direction of a fan. If no airflow is driven by the fan or a stagnancy is caused by too much accumulated heat, the heat exchange effect of the conventional vortex generators will be so small that the heat dissipating efficiency cannot be enhanced.

In view of the aforementioned shortcomings of the prior art, the present Inventor proposes a novel and reasonable structure based on years of experience in the related industry and extensive researches.

SUMMARY OF THE INVENTION

Therefore, it is a primary objective of the present invention to provide a heat dissipating apparatus with a vortex generator. Each heat dissipating fin is provided with the vortex generators, so that the heat dissipating apparatus can induce a stack effect by means of the vortex generators on and below each heat dissipating fin. In this way, the heat accumulated between the respective dissipating fins can be dissipated to achieve the heat dissipating effect automatically.

To achieve the foregoing objective, the present invention provides a heat dissipating apparatus with a vortex generator, which comprises: a heat conducting base, at least one heat pipe, and a plurality of heat dissipating fins, wherein the heat pipe is coupled to the heat conducting base and sequentially penetrates the heat dissipating fins, each heat dissipating fin includes a pair of vortex generators installed with an interval apart and disposed adjacent to a side of the heat pipe, each vortex generator has two guiding oblique surfaces protruding from a surface of the heat dissipating fin, and the two guiding oblique surfaces protrude in a tapered form, a through hole is formed at a wide position and penetrates through the heat dissipating fin.

In comparison with prior art, the present invention has advantages as follows. Since the vortex generators protrude from each heat dissipating fin, the total area for heat dissipation will be increased. Further, since external cold air flowing through the adjacent two heat dissipating fins is disturbed by the protruding vortex generators, it takes more time for the external cold air to pass through the adjacent two heat dissipating fins, so that the time for heat exchange is extended and thus the heat transfer is improved greatly.

DESCRIPTION OF THE PREFERRED EMBODIMENTS

The technical characteristics and contents of the present invention will become apparent with the following detailed description and related drawings. The drawings are provided for the purpose of illustrating the present invention only, but not intended for limiting the scope of the invention.

Figure 1:
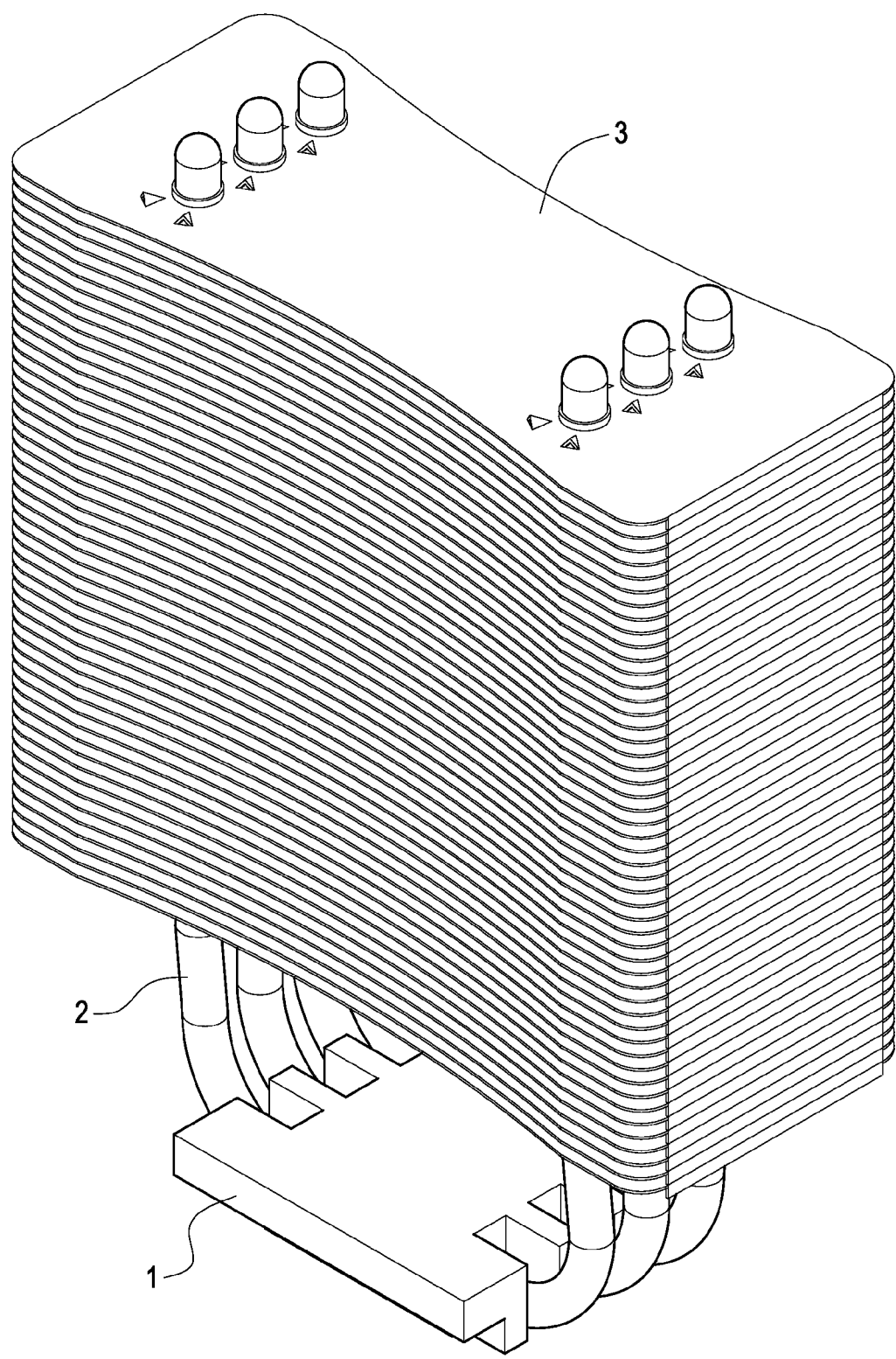
FIG. 1 is a perspective view of the present invention.

With reference to FIG. 1 for a perspective view of the present invention, the present invention provides a heat dissipating apparatus with a vortex generator, which comprises: a heat conducting base 1, at least one heat pipe 2, and a plurality of heat dissipating fins 3.

The heat conducting base 1 is made of a material with good thermal conductivity such as aluminum and copper and substantially in form of a plate adhered to a heat-generating electronic component (not shown in the figure) such as a CPU of a computer. The heat pipe 2 is coupled to the heat conducting base 1 and sequentially penetrating the heat dissipating fins 3, such that the heat conducting base 1 can absorb the heat generated by the heat-generating electronic component and conduct the heat to each heat dissipating fin 3 quickly. More specifically, each heat dissipating fin 3 has a corresponding penetrating hole 30 formed thereon and a circular flange 31 protruding from the periphery of each penetrating hole 30. The heat pipe 2 sequentially penetrates through the penetrating hole 30 of each heat dissipating fin 3 and closely contacts each circular flange 31. In this preferred embodiment of the invention, there is a plurality of heat pipes 2.

Figure 2:
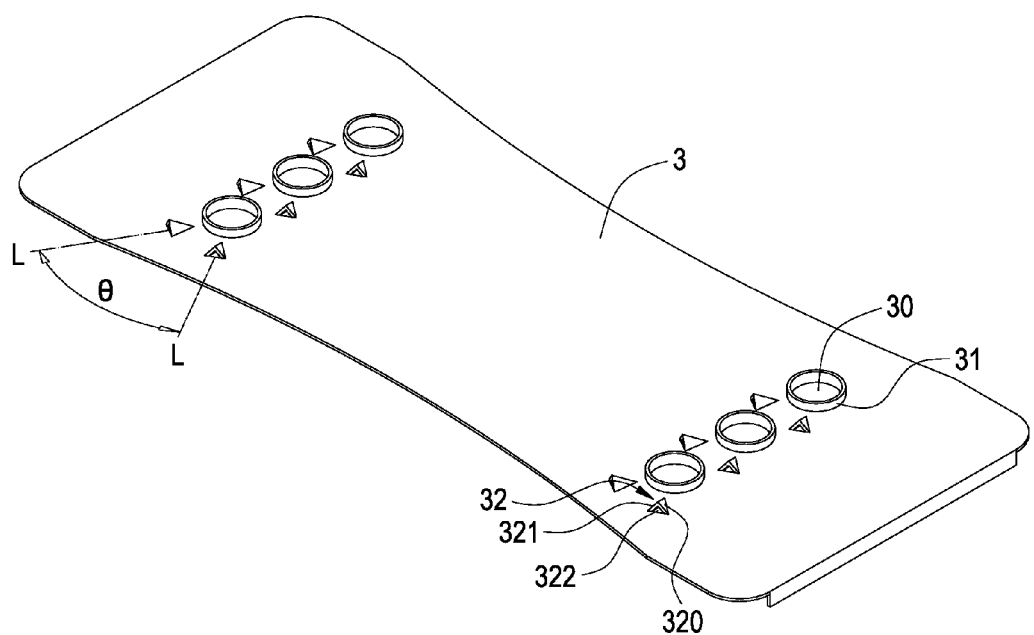
FIG. 2 is a perspective view of a heat dissipating fin in accordance with a preferred embodiment of the present invention.
Figure 3:
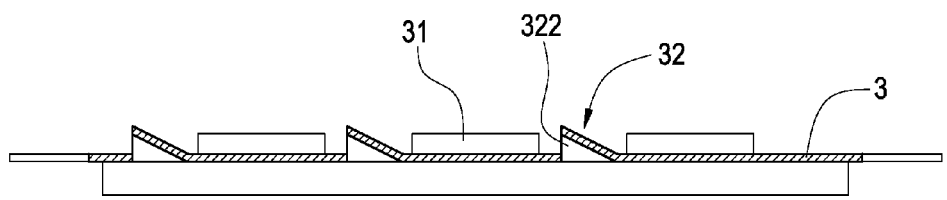
FIG. 3 is a planar cross-sectional view of the heat dissipating fin of the present invention.

With reference to FIGS. 2 and 3, the present invention comprises at least one pair of vortex generators 32 installed with an interval apart on each heat dissipating fin 3 and disposed proximate to a backwind side of the heat pipe 2. In other words, a pair of vortex generators 32 are installed at a side of the backwind side of each heat pipe 2, such that after an external airflow (such as the airflow of a fan) flows to a windward side of the heat pipe 2, the airflow will pass between the two vortex generators 32 and produce a spiral vortex to drive the air at the backwind side of the heat pipe 2 to flow, thereby dissipating the hot air at the backwind side of the heat pipe 2. Each vortex generator 32 has two guiding oblique surfaces 320, 321 protruding from a surface of the heat dissipating fin 3, and the two guiding oblique surfaces 320, 321 protrude in a tapered form. The narrow position is aligned towards an adjacent heat pipe 2, and a through hole 322 is formed at the wide position and penetrates through the heat dissipating fin 3.

Figure 4:
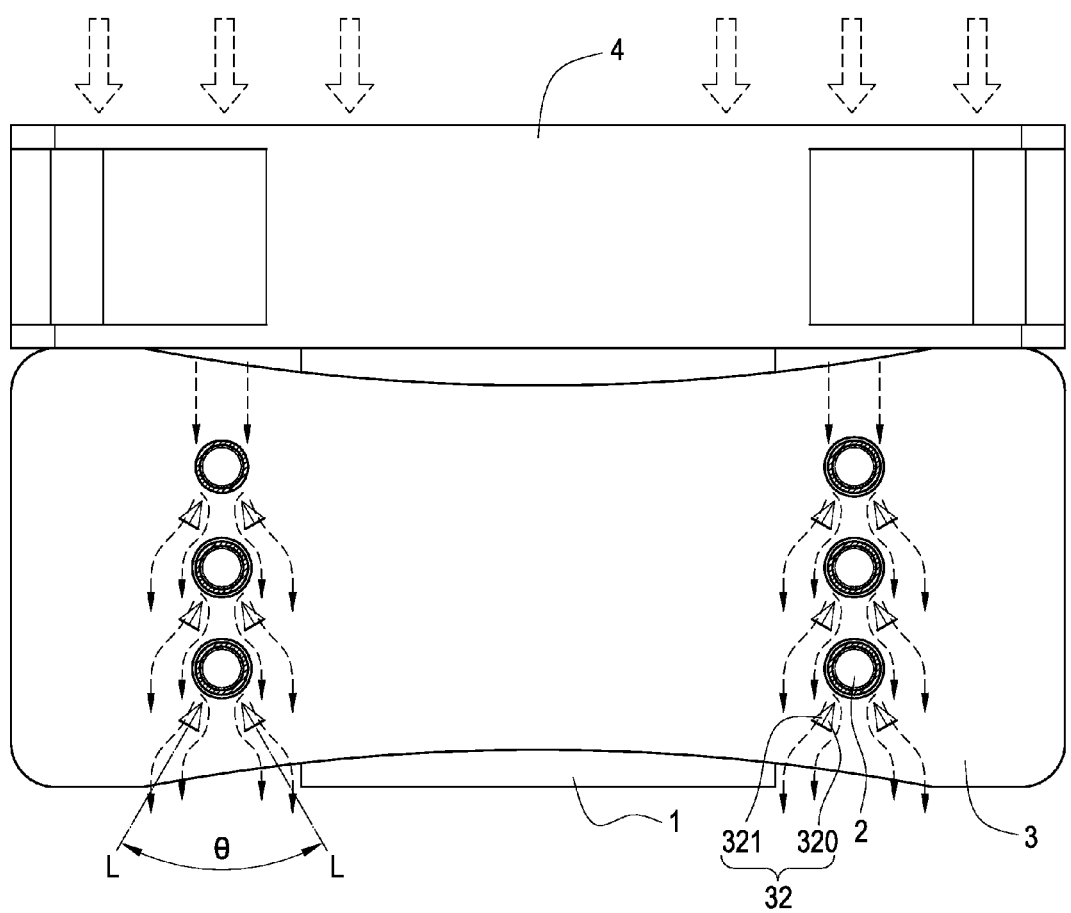
FIG. 4 is a top view of a using status of the present invention.

With reference to FIG. 4 for a more detailed description, since the two guiding oblique surfaces 320, 321 of each vortex generator 32 protrudes to be intersected with each other to form a ridge L, and the ridge L of any two adjacent vortex generators 32 extend in a direction towards the narrow position, and the included angle θ produced by the ridges L of two adjacent vortex generators 32 is preferably equal to 60°, but the present invention is not limited to such angle only.

With the aforementioned assembly, the heat dissipating apparatus with a vortex generator of the present invention can be achieved.

Figure 5:
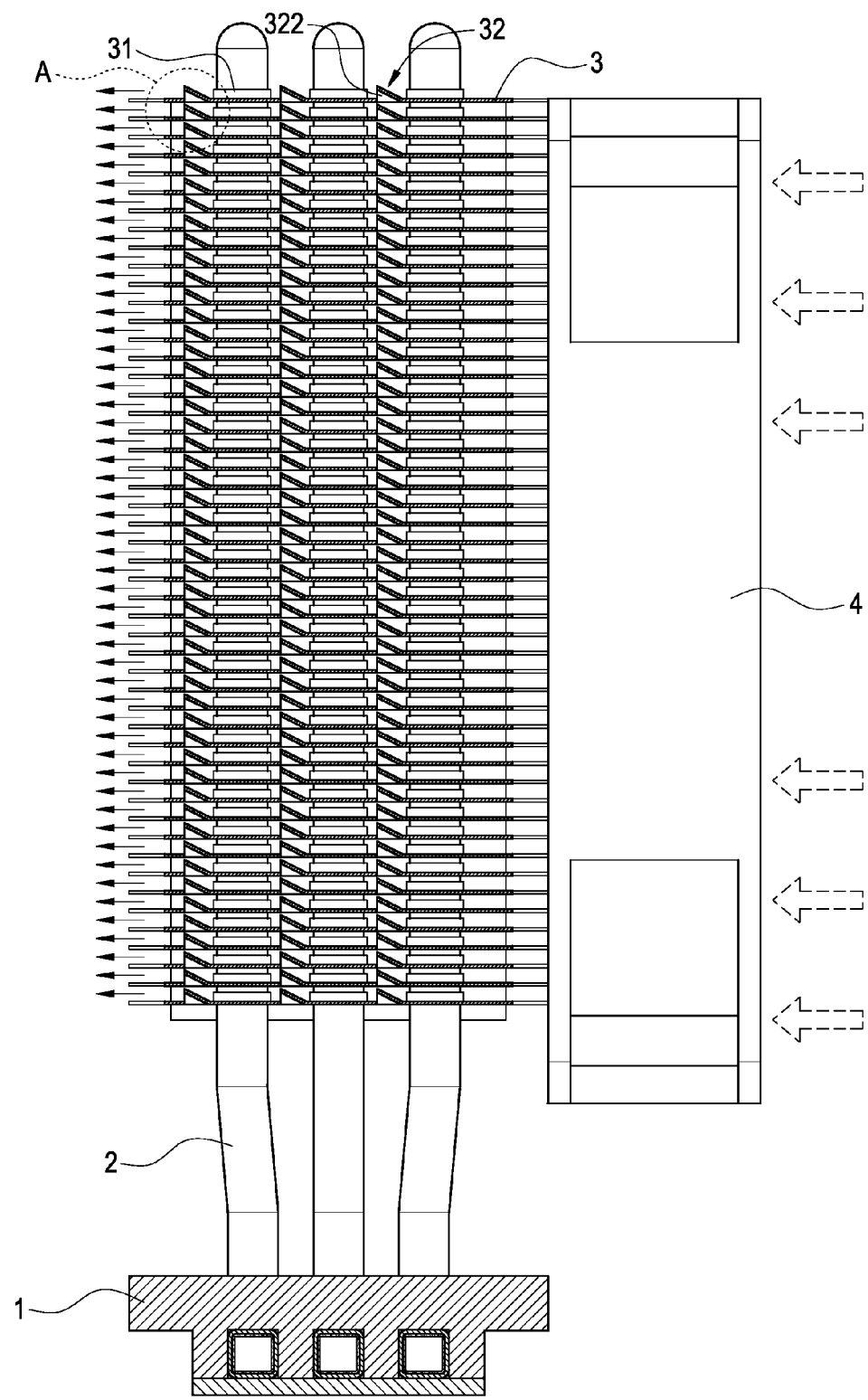
FIG. 5 is a side view of a using status of the present invention.
Figure 6:
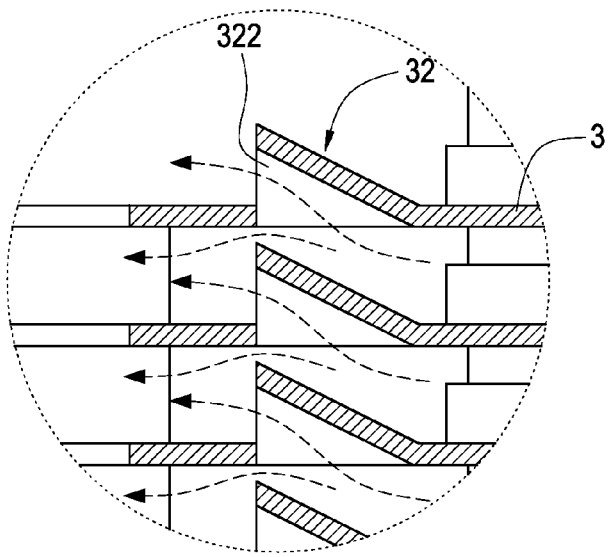
FIG. 6 is an enlarged view of the portion A in FIG. 5.

In FIG. 4, a fan 4 is further disposed on one side of each heat dissipating fin 3 of the heat dissipating apparatus, thereby assisting the heat dissipation of each heat dissipating fin 3. After the airflow produced by the fan 4 passes through the windward side of the heat pipe 2, a portion of the airflow will flow along the external guiding oblique surfaces 320, 321 of the two vortex generators 32, and another portion of the airflow will enter the two vortex generators 32 to accelerate the dissipation of the heat accumulated at the backwind side of the heat pipe 2. In FIGS. 5 and 6, since each vortex generator 32 has a through hole 322 penetrating through the heat dissipating fin 3, after the heat dissipating fins 3 are stacked up, each through hole 322 forms a passage for the hot airflow to flow and rise. As a result, the hot air that cannot be driven away by the wind produced by the fan 4 can rise and escape naturally. Thus, a stack effect is induced to achieve the heat dissipation.

Figure 7:
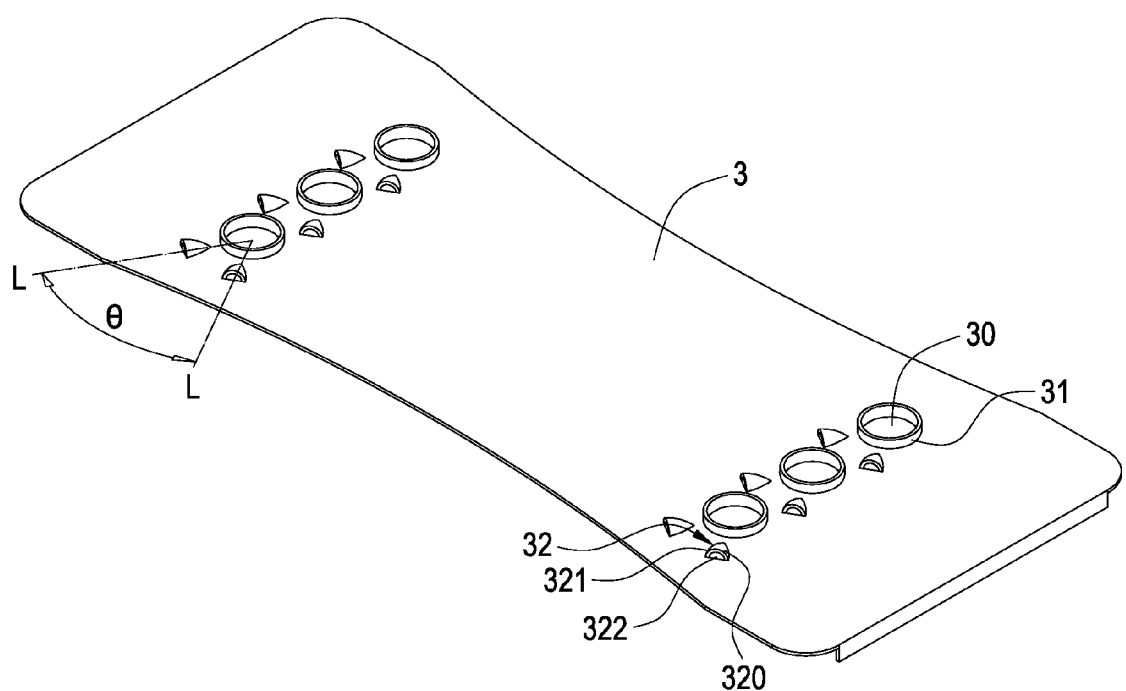
FIG. 7 is a perspective view of the heat dissipating fin in accordance with another preferred embodiment of the present invention.
Figure 8:
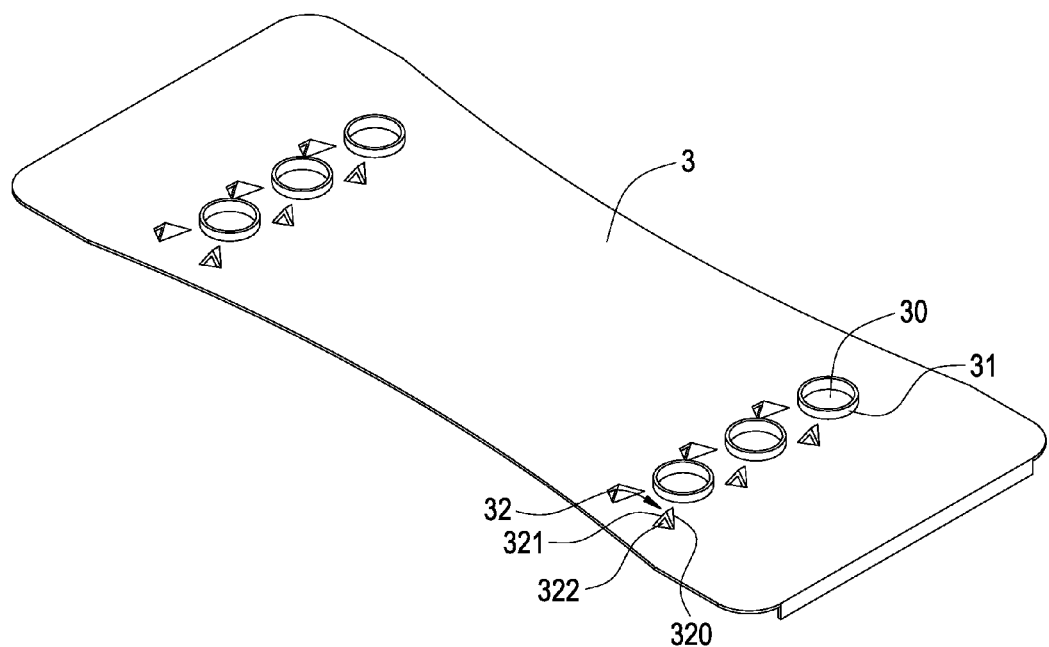
FIG. 8 is a perspective view of the heat dissipating fin in accordance with a further preferred embodiment of the present invention.
Figure 9:
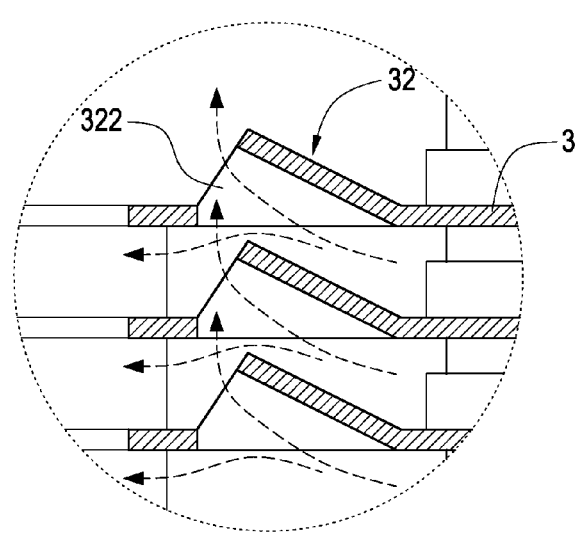
FIG. 9 is a partially enlarged view of the heat dissipating fin in accordance with the further preferred embodiment of the present invention.

With reference to FIG. 7 for a perspective view of a heat dissipating fin in accordance with another preferred embodiment of the present invention, the two guiding oblique surfaces 320, 321 of each vortex generator 32 can protrude to form a circular arc shape. In FIGS. 8 and 9, the through hole 322 of each vortex generator 32 is oriented upwardly and obliquely to facilitate the hot air to rise and escape vertically. By this arrangement, a stack effect is induced to achieve a better heat dissipation.

Figure 10:
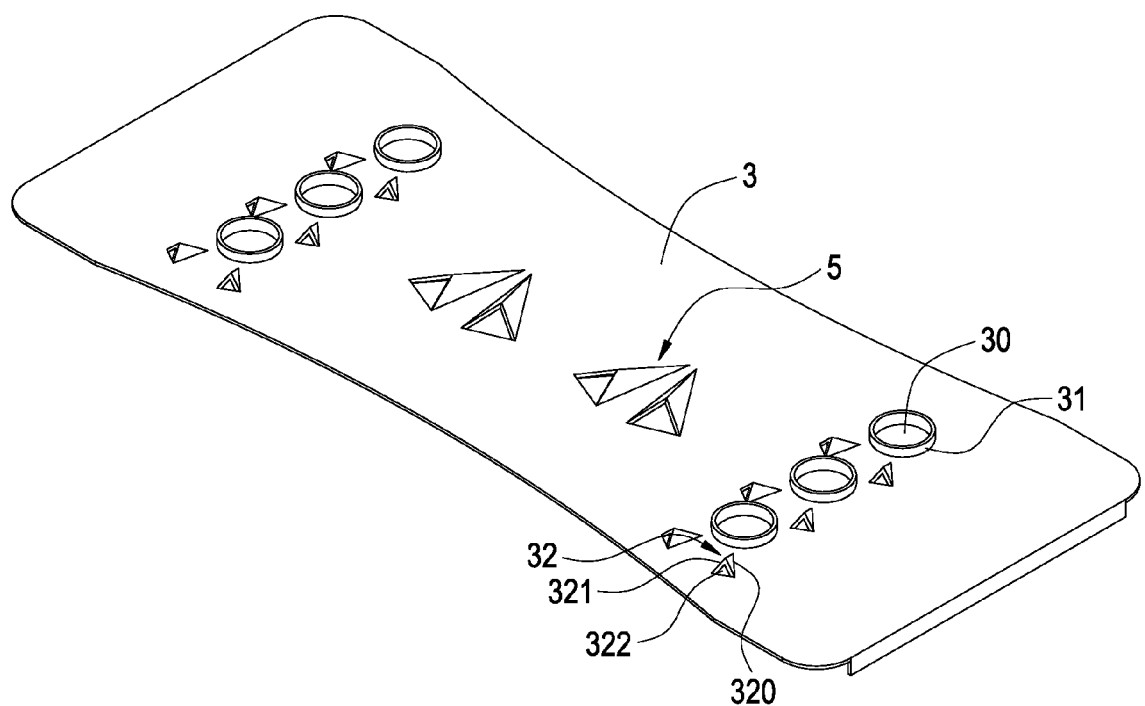
FIG. 10 is a perspective view of the heat dissipating fin in accordance with a still further preferred embodiment of the present invention.

With reference to FIG. 10 for a perspective view of a heat dissipating fin in accordance with a further preferred embodiment of the present invention, each heat dissipating fin 3 further comprises transversally arranged auxiliary vortex generators 5. The auxiliary vortex generators 5 may be provided in pairs.

To sum up the above, the present invention improves over the prior art and complies with the patent application requirements, and thus is duly filed for patent application.

While the invention has been described by means of specific embodiments, numerous modifications and variations could be made thereto by those skilled in the art without departing from the scope and spirit of the invention set forth in the claims.

What is claimed is:

1. A heat dissipating apparatus, comprising:
   a heat conducting base (1);
   a plurality of heat pipes (2), coupled to the heat conducting base (1) and linearly arranged along an axis; and
   a plurality of heat dissipating fins (3), sequentially penetrated by the plurality of heat pipes (2);
   wherein a pair of vortex generators (32) are installed with an interval apart on each of the heat dissipating fins (3), the pair of vortex generators (32) are disposed proximate to a side of each of the plurality of heat pipe (2) respectively, and the pair of vortex generators (32) are disposed symmetrically to each other along the axis and equally spaced from a corresponding heat pipe, each vortex generator (32) has two guiding oblique planar triangle surfaces (320), (321) protruding from a surface of the heat dissipating fin (3) and intersecting to form a ridge (L), each of the two guiding oblique planar triangle surfaces (320), (321) includes a wide end side and a narrowed end, the ridge (L) extends toward the narrowed ends of the two guiding oblique planar triangle surfaces (320), (321) to point to the side of the heat pipe (2) and ascends from the surface of the heat dissipating fin (3) in a direction from an upwind side to a downwind side, and a through hole (322) is formed by the wide end sides of the two guiding oblique planar triangle surfaces (320), (321) and penetrates through the heat dissipating fin (3), and thus the through hole (322) is formed as a triangle shape on the heat dissipating fin (3), wherein two sides of the through hole (322) are the wide end sides of the two guiding oblique planar triangle surfaces (320) and third side of the triangle through hole (322), (321) is a cutting edge of the heat dissipating fin (3) at the through hole,
   wherein the ridges (L) of the pair of the vortex generators (32) start from the wide end sides of the two guiding oblique planar triangle surfaces (320), (321) and extend in a direction towards the narrowed ends of the two guiding oblique planar triangle surfaces (320), (321) to form an intersection at a center of the corresponding heat pipe, and
   wherein the through hole (322) of each vortex generator (32) is oriented upwardly and obliquely, thereby creating Stack Effect which forces an air in a lower level heat dissipating fin (3) to go up through the through hole (322) to an upper level heat dissipating fin (3).

2. The heat dissipating apparatus with a vortex generator as recited in claim 1, wherein the heat conducting base (1) is substantially a plate.

3. The heat dissipating apparatus with a vortex generator as recited in claim 1, wherein each heat dissipating fin (3) has a penetrating hole (30) formed correspondingly thereon for allowing the heat pipe (2) to pass through.

4. The heat dissipating apparatus with a vortex generator as recited in claim 3, wherein each penetrating hole (30) has a circular flange (31) protruding from the periphery of the penetrating hole (30) for keeping a close contact with the heat pipe (2).

5. The heat dissipating apparatus with a vortex generator as recited in claim 1, wherein the two ridges (L) are intersected to produce an included angle θ of 60°.

6. The heat dissipating apparatus with a vortex generator as recited in claim 1, wherein each heat dissipating fin (3) includes a plurality of auxiliary vortex generators (5) arranged transversally on the heat dissipating fin (3).

7. The heat dissipating apparatus with a vortex generator as recited in claim 6, wherein the auxiliary vortex generators (5) are provided in pairs.

* * * * *